(12) United States Patent
Chang et al.

(10) Patent No.: US 7,308,244 B2
(45) Date of Patent: Dec. 11, 2007

(54) LOW VOLTAGE MIXER

(75) Inventors: Simon Chang, Cambridge (GB); Ian Michael Sabberton, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 429 days.

(21) Appl. No.: 11/131,339

(22) Filed: May 18, 2005

(65) Prior Publication Data
US 2005/0272398 A1 Dec. 8, 2005

(30) Foreign Application Priority Data
Jun. 3, 2004 (GB) ................................ 0412406.1

(51) Int. Cl.
H04B 1/26 (2006.01)

(52) U.S. Cl. ...................... 455/326; 455/131
(58) Field of Classification Search ................ 455/110, 455/118, 131, 313, 323, 326, 334; 327/100, 327/113
See application file for complete search history.

(56) References Cited

U.S. PATENT DOCUMENTS

| | | | |
|---|---|---|---|
| 5,864,255 A | 1/1999 | Kwok et al. | |
| 5,995,819 A | 11/1999 | Yamaji et al. | |
| 6,711,396 B1 * | 3/2004 | Bergsma et al. | 455/313 |
| 7,181,186 B2 * | 2/2007 | Oh et al. | 455/323 |

* cited by examiner

Primary Examiner—Quochien B. Vuong
(74) Attorney, Agent, or Firm—Novak Druce DeLuca + Quigg LLP

(57) ABSTRACT

A mixer comprising a pair of low frequency mixer inputs, a pair of high frequency mixer inputs, a pair of mixer outputs, four switching units, each switching unit comprising a low frequency switching unit input, a high frequency switching unit input, a switching unit output, a node connected via a high pass filter to the respective high frequency switching unit input and via a low pass filter to the respective low frequency switching unit input and a switching device arranged to provide an output at the respective switching unit output in dependence on the voltage at the respective node, and comprising a first feedback loop responsive to the voltage at the first low frequency mixer input and arranged to regulate the current through the outputs of the first and second ones of the switching units so that the total current through the outputs of the first and second ones of the switching units is substantially proportional to the voltage at the first low frequency mixer input and a second feedback loop responsive to the voltage at the second low frequency mixer input and arranged to regulate the current through the outputs of the third and fourth ones of the switching units so that the total current through the outputs of the third and fourth ones of the switching units is substantially proportional to the voltage at the second low frequency mixer input.

13 Claims, 2 Drawing Sheets

*Reduced voltage headroom mixer*

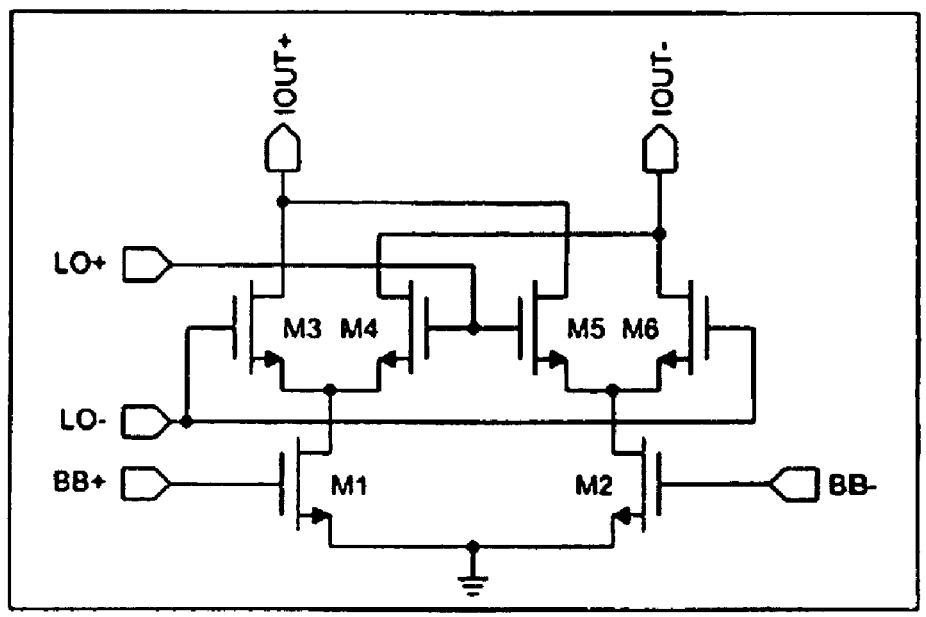
Figure 1: *NMOS Gilbert Mixer Cell.*
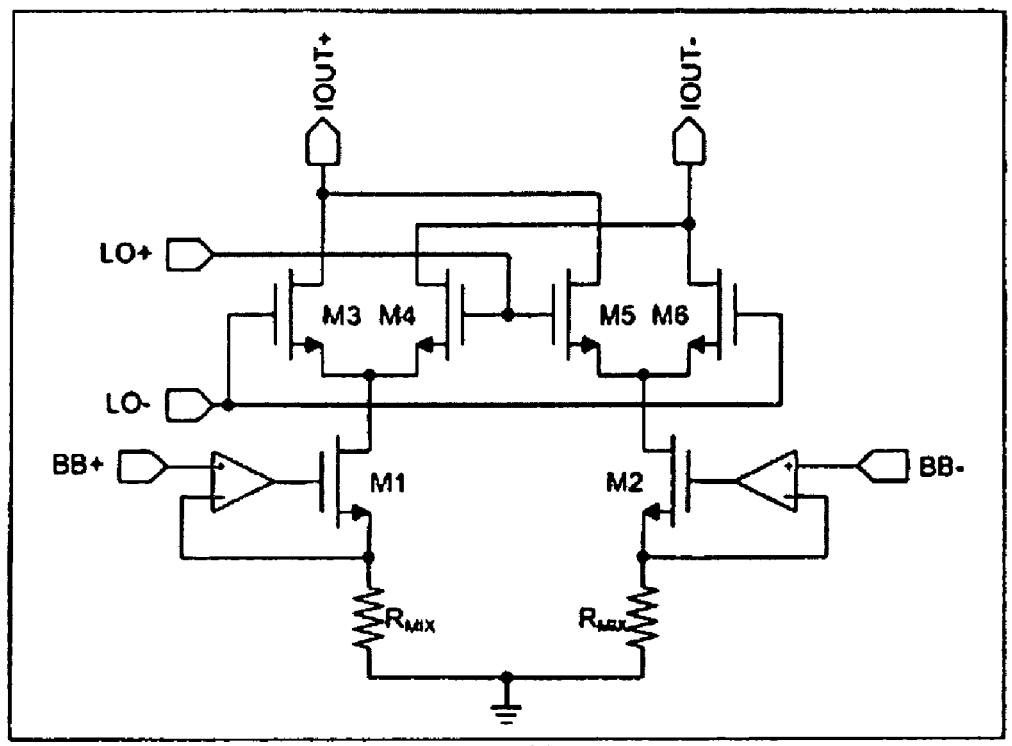
Figure 2: *Improved linearity mixer.*

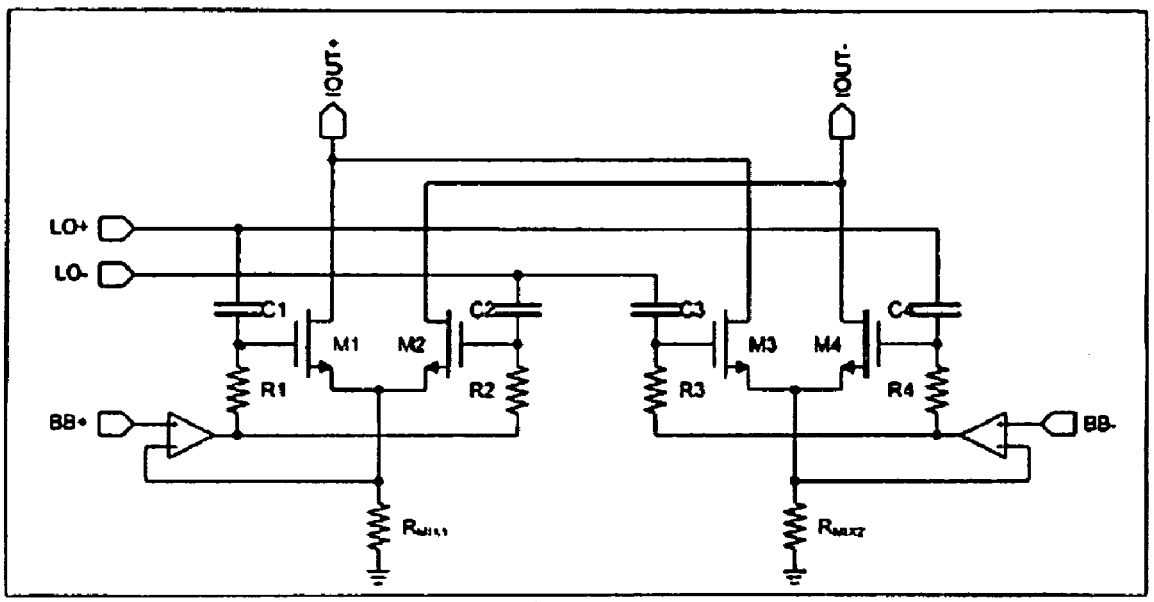
Figure 3: *Reduced voltage headroom mixer*

LOW VOLTAGE MIXER

The present invention relates to mixers, especially mixers that are suitable for operating at a relatively low voltage.

One use of mixers is for combining a local oscillator signal and a baseband signal for the purposes of transmission. A traditional 'Gilbert cell' mixer design is shown in FIG. 1. The mixer has four input terminals. The local oscillator signal is connected across two of the input terminals and the baseband signal is connected across the two remaining input terminals. The mixer also has two output terminals, across which the 'mixed' output signal is generated.

The Gilbert cell mixer comprises six transistors (shown as NMOS transistors in FIG. 3). The gate of each transistor is connected to one of the input terminals. Each transistor is therefore under the control of one of the input signals. A Gilbert cell mixer is a compact, efficient approach to combining a differential amplifier with a phase reversing switch mixer. The baseband inputs modulate the currents in the transistors to which they are connected, causing those transistors to act as differential amplifiers. Normally the transistors connected to the local oscillator are effectively switches, where a 'high' input causes them to switch on and a 'low' input causes them to switch off. The transistors connected to the local oscillator input can reverse the phase or polarity of the current from the baseband transistors, depending on whether they are 'on' or 'off'.

The mixer can be considered as consisting of four switch arrangements, each comprising two transistors. For example, in FIG. 1 the first switch arrangement would comprise transistors M1 and M3, the second switch arrangement would comprise transistors M1 and M4 and so on.

As shown in FIG. 1, the baseband inputs each control one transistor (a 'baseband transistor'), the transistors each belonging to two switch arrangements. These transistors can be thought of as switches that each 'enable' the switch arrangements of which they form part. As the first two switch arrangements are under the control of the positive baseband input and the remaining two switch arrangements are under the control of the negative baseband input, the first and second pair of switch arrangements are enabled alternately.

Each switch arrangement consists of a further transistor (a 'local oscillator transistor'), which is controlled by one of the local oscillator inputs. Each local oscillator input is connected to the gates of two transistors. The circuit is arranged such that of the two switch arrangements enabled by the same baseband input, one will have its further transistor controlled by the positive local oscillator signal and the other will have its further transistor controlled by the negative local oscillator signal.

The output of each switch arrangement is low only when both transistors are on, i.e. conducting, and the output is short-circuited to earth. This corresponds with the gate signals to the transistors being high. Therefore, the output of each switch arrangement is high unless both input signals are high.

Each output terminal from the mixer circuits is connected to the outputs of two switch arrangements. Each output terminal is connected to one switch arrangement enabled by the first baseband input and one switch arrangement enabled by the second baseband input. One output terminal outputs the positive output signal, while the other outputs the negative output signal.

As the input signals are of different frequencies, the net effect of the combination of switch arrangements is to multiply the baseband signal by the local oscillator signal.

One of the problems with the Gilbert mixer cell is the non-linearity of the baseband-input devices (the 'enabling' transistors M1 and M2) when used to create relatively high amplitude radiofrequency signals. Since the baseband signals are relatively low frequency, the devices can be linearised with a feedback loop as shown in FIG. 2. The feedback loop comprises a resistor and an operational amplifier and operates to ensure that the current of the out of the baseband devices is linearly related to the input voltage by $I_{mix}=V_{in}/R_{mix}$. However, the feedback loop adds complexity to the circuit.

A further problem associated with the Gilbert mixer cell arises from the double layer of transistors in each switch arrangement: the transistors attached to the baseband inputs have to be in saturation mode and for typical implementations must have a forward voltage of some 100s of millivolts. Therefore, the voltages on the local oscillator inputs need to be above this voltage by more than the threshold voltage of the transistors. This double layer of transistors then requires operating voltages that are unacceptably high for low voltage integrated circuits.

The possible options for decreasing the output voltage in the mixer circuit shown in FIG. 1 can be considered as follows.

In order for the mixer to operate correctly, all transistors must be in saturation mode. This occurs when equation 1 holds true.

$$V_{ds} > V_{gs} - V_T \quad (1)$$

Where $V_{ds}$ is the voltage between the drain and source of the transistor, $V_{gs}$ is the gate source voltage and $V_T$ is the threshold voltage of the transistor.

In saturation mode the current through an NMOS transistor can be approximated by equation 2.

$$I_{ds} = K \cdot \frac{W}{L} \cdot (V_{gs} - V_T)^2 \quad (2)$$

Where K is the device transconductance and W and L are the width and length of the transistor.

Equations 1 and 2 can be combined into equation 3, which expresses the saturation requirement in terms of transistor current.

$$V_{ds} > \sqrt{I_{ds} \cdot \frac{L}{K \cdot W}} \quad (3)$$

Under worst case conditions, all of the mixer current will be flowing through one baseband transistor and one local oscillator transistor (e.g. M1 and M3 of FIG. 2). Thus to keep all devices saturated at all times, equation 4 must be true:

$$V_{out} > V_{inmax} + \sqrt{\frac{V_{inmax}}{R_{mix}} \cdot \frac{L_{BB}}{K_{min} \cdot W_{BB}}} + \sqrt{\frac{V_{inmax}}{R_{mix}} \cdot \frac{L_{LO}}{K_{min} \cdot W_{LO}}} \quad (4)$$

Note that $K_{min}$ has replaced K. $K_{min}$ represents the lowest expected value of device transconductance across process. $W_{BB}$ and $L_{BB}$ represent the width and length of the baseband transistors and $W_{LO}$ and $L_{LO}$ represent the width and length of the local oscillator transistors.

Based on equation 4, there are several options for reducing the minimum required value for $V_{out}$. These are outlined in table 1, along with the factors that limit these options.

TABLE 1

Options for decreasing minimum required $V_{out}$.

| Option | Limitation |
| --- | --- |
| Decrease $V_{inmax}$ | Reduces the dynamic range of the input to the mixer |
| Increase $R_{mix}$ | Reduces the gain of the mixer |
| Increase $W_{BB}/L_{BB}$ | Reduces the bandwidth of the mixer or requires faster (and more power-hungry) servo amplifier |
| Increase $W_{LO}/L_{LO}$ | Increase the capacitative loading on the local oscillator |

There is a need for a low voltage headroom mixer that is capable of operating at relatively low voltages while addressing at least some of the limitations outlined in table 1.

According to a first embodiment of this invention there is provided a mixer comprising a pair of low frequency mixer inputs for receiving a low frequency input signal therebetween, a pair of high frequency mixer inputs for receiving a high frequency input signal therebetween, a pair of mixer outputs, four switching units, each switching unit comprising a low frequency switching unit input, a high frequency switching unit input, a switching unit output, a node connected via a high pass filter to the respective high frequency switching unit input and via a low pass filter to the respective low frequency switching unit input and a switching device arranged to provide an output at the respective switching unit output in dependence on the voltage at the respective node, a first one of the low frequency mixer inputs being connected to the low frequency inputs of a first and a second one of the switching units, a second one of the low frequency mixer inputs being connected to the low frequency inputs of a third and a fourth ones of the switching units, a first one of the high frequency mixer inputs being connected to the high frequency inputs of the first and the fourth ones of the switching units, a second one of the high frequency mixer inputs being connected to the high frequency inputs of the second and the third ones of the switching units, a first one of the mixer outputs being connected to the outputs of the first and the third ones of the switching units and a second one of the mixer outputs being connected to the outputs of the second and the fourth ones of the switching units and the mixer further comprising a first feedback loop responsive to the voltage at the first low frequency mixer input and arranged to regulate the current through the outputs of the first and second ones of the switching units so that the total current through the outputs of the first and second ones of the switching units is substantially proportional to the voltage at the first low frequency mixer input and a second feedback loop responsive to the voltage at the second low frequency mixer input and arranged to regulate the current through the outputs of the third and fourth ones of the switching units so that the total current through the outputs of the third and fourth ones of the switching units is substantially proportional to the voltage at the second low frequency mixer input.

Preferably the high pass filter is or comprises a capacitive element, most preferably one or more capacitors.

Preferably the low pass filter is or comprises a resistive element, most preferably one or more resistors.

Preferably the high frequency input signal has a frequency greater than 1 GHz and the low frequency input signal has a frequency less than 10 MHz. The mixer is preferably arranged in a circuit such that those signals can be fed to it at those frequencies.

Preferably the first feedback loop comprises a first differential amplifier and a first resistor and the second feedback loop comprises a second differential amplifier and a second resistor.

Preferably the differential amplifiers have two input terminals and an output terminal and the first differential amplifier has a first input terminal connected to the first low frequency mixer input, a second input terminal connected to a reference input of the first and second switching units and an output terminal connected to the low pass filters of the first and second switching units and the second differential amplifier has a first input terminal connected to the second low frequency mixer input, a second input terminal connected to a reference input of the third and fourth switching units and an output terminal connected to the low pass filters of the third and fourth switching units.

Preferably each switching device comprises, and most preferably is, a transistor. Preferably means are provided for biasing each such transistor such that each transistor operates in saturation mode. Preferably the biasing means for the first and second switching units comprise the first feedback loop and the biasing means for the third and fourth switching units comprise the second feedback loop.

According to a second embodiment of this invention there is provided a radio transceiver comprising a mixer and wherein the pair of low frequency mixer inputs are connected to receive a baseband signal therebetween, the pair of high frequency mixer inputs are connected to receive a local oscillator signal therebetween and the mixer outputs are connected to a transmitter output.

According to a third embodiment of this invention there is provided an integrated circuit comprising a mixer and wherein the pair of low frequency mixer inputs are connected to receive a baseband signal therebetween, the pair of high frequency mixer inputs are connected to receive a local oscillator signal therebetween and the mixer outputs are connected to a transmitter output.

For a better understanding of the present invention, reference is made to the following drawings in which:

FIG. 1 shows a Gilbert cell mixer;

FIG. 2 shows a Gilbert cell mixer with the addition of a feedback loop;

FIG. 3 shows a first embodiment of the present invention.

The mixer shown in FIG. 3 comprises four transistors, each of which effectively acts as a switch that is controlled by the signal input to the gate of the transistor.

In FIG. 3 the transistors shown are NMOS transistors. However, it should be understood that this invention is limited neither to the polarity nor type of transistors shown in the drawings, which are for illustrative purposes only.

The mixer circuit has four input terminals. A local oscillator signal is connected across two of the input terminals and a baseband signal is connected across the two remaining input terminals. The mixer also has two output terminals, across which a 'mixed' output signal is connected.

The mixer circuit can be considered as consisting of four switch circuits, each containing one transistor, a low pass filter and a high pass filter (e.g. the first switch circuit comprises M1, C1 and R1). The operation of the switch circuits can be explained by considering them individually.

The transistor of each switch circuit can be considered as a switch that is controlled by the signal at the node connected to its gate input (the control node). The baseband and local oscillator signals are connected to the control node by means of a low pass filter and a high pass filter.

The high pass filter is provided by a capacitor, which effectively acts as a short circuit for high frequency signals. Therefore, the capacitor provides a low impedance path into the gate of the transistor for the high frequency local oscillator signal. As the path provided by the resistor has a much higher impedance than this, the local oscillator input signal does not travel beyond the control node.

The low pass filter is provided by a resistor. The resistor prevents the local oscillator signal from travelling into the baseband input. However, since the capacitor effectively appears as an open circuit to the low frequency baseband input signal, the resistor provides a path of lower impedance and the baseband signal is connected into the gate of the transistor. The baseband signal does not travel beyond the control node.

The resistor capacitor pairs of each switch circuit act as AC coupling, allowing the local oscillator and baseband signals to combine on the gates of the transistors.

Therefore, the baseband signal and the local oscillator signal are combined at a single node, the mixer using a single set of transistors for both baseband and local oscillator signals.

Each transistor is controlled by the signal connected to its gate input. The transistors switch on and off as the signal at each corresponding control node goes high and low respectively.

The baseband signal is connected to a switch circuit by means of a feedback loop comprising a differential amplifier and a resistor. Typically, the differential amplifier will be an operational amplifier. However, it should be understood that the present invention is not limited to any particular type of amplifier and any appropriate differential amplifier might be used, e.g. an operational transconductance amplifier. The resistor will typically be a reference resistor, which connects the switch circuits to a reference voltage (e.g. $R_{MIX1}$ and $R_{MIX2}$ in FIG. 3). The baseband signal is input to the positive input of the differential amplifier. The negative input is connected to the input to the reference resistor, i.e. to the source input of two transistors (either M1 and M2 or M3 and M4). The output of the differential amplifier is connected to the low pass filter, i.e. the resistor as described above.

The feedback arrangement as described above operates to ensure that the current output from the transistor of a switch circuit is linearly related to the input voltage, optimally by $I_{mix}=V_{in}/R_{mix}$. To achieve this, the differential amplifier can be selected and configured accordingly. In practice, the relationship will not be precisely linear.

The feedback loop may further operate to ensure that the transistor operates in its saturation mode. Although the transistors will typically operate in saturation mode, this is not necessarily the case and no limitation to the present invention in that respect should be inferred.

The four switch circuits, as described above, are connected as follows: the positive local oscillator input is connected to the high pass filters of the first and fourth switch circuits; the negative local oscillator input is connected to the high pass filters of the second and third switch circuits; the positive baseband input is connected via the differential amplifier of the feedback loop to the low pass filters of the first and second switch circuits; the negative baseband input is connected via the differential amplifier of the feedback loop to the low pass filters of the third and fourth switch circuits; the positive output is connected to the drains of the transistors of the first and third switch circuits and the negative output is connected to the drains of the transistors of the second and fourth switch circuits.

The output signal of the mixer circuit described above consists of the high frequency local oscillator signal superimposed on the lower frequency baseband signal.

As the mixer described above has only one layer of transistors for the current to pass through, the minimum required $V_{out}$ is now given by equation 5.

$$V_{out} > V_{in\max} + \sqrt{\frac{V_{in\max}}{R_{mix}} \cdot \frac{L}{K_{\min} \cdot W}} \tag{5}$$

The circuit described in the preferred embodiment of the invention consists of a low voltage headroom mixer that may be seen as an enhancement of a linearised Gilbert cell. The preferred embodiment of the invention passes the bias current through only a single layer of transistors. With reduced headroom, the mixer can be made to run at higher frequencies and lower supply voltages.

Typically the local oscillator signal will have a frequency greater than 1 GHz and the baseband signal will have a frequency less than 10 MHz. However, the mixer of the present invention is not limited to operating with any particular input frequencies.

The circuit may be implemented in discrete components or, more preferably, as a single integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A mixer comprising:
 a pair of low frequency mixer inputs for receiving a low frequency input signal therebetween;
 a pair of high frequency mixer inputs for receiving a high frequency input signal therebetween;
 a pair of mixer outputs;
 four switching units, each switching unit comprising a low frequency switching unit input, a high frequency switching unit input, a switching unit output, a node connected via a high pass filter to the respective high frequency switching unit input and via a low pass filter to the respective low frequency switching unit input and a switching device arranged to provide an output at the respective switching unit output in dependence on the voltage at the respective node;
 a first one of the low frequency mixer inputs being connected to the low frequency inputs of a first and a second one of the switching units;

a second one of the low frequency mixer inputs being connected to the low frequency inputs of a third and a fourth one of the switching units;

a first one of the high frequency mixer inputs being connected to the high frequency inputs of the first and the fourth ones of the switching units;

a second one of the high frequency mixer inputs being connected to the high frequency inputs of the second and the third ones of the switching units;

a first one of the mixer outputs being connected to the outputs of the first and the third ones of the switching units; and a second one of the mixer outputs being connected to the outputs of the second and the fourth ones of the switching units;

and the mixer further comprising:

a first feedback loop responsive to the voltage at the first low frequency mixer input and arranged to regulate the current through the outputs of the first and second ones of the switching units so that the total current through the outputs of the first and second ones of the switching units is substantially proportional to the voltage at the first low frequency mixer input; and a second feedback loop responsive to the voltage at the second low frequency mixer input and arranged to regulate the current through the outputs of the third and fourth ones of the switching units so that the total current through the outputs of the third and fourth ones of the switching units is substantially proportional to the voltage at the second low frequency mixer input.

2. A mixer as claimed in claim 1, wherein the high pass filter comprises a capacitive element.

3. A mixer as claimed in claim 1, wherein the low pass filter comprises a resistive element.

4. A mixer as claimed in claim 1, wherein the high frequency input signal has a frequency greater than 1 GHz.

5. A mixer as claimed in claim 1, wherein the low frequency input signal has a frequency less than 10 MHz.

6. A mixer as claimed in claim 1, wherein the first feedback loop comprises a first differential amplifier and a first resistor and the second feedback loop comprises a second differential amplifier and a second resistor.

7. A mixer as claimed in claim 6, wherein the differential amplifiers have two input terminals and an output terminal and wherein the first differential amplifier has a first input terminal connected to the first low frequency mixer input, a second input terminal connected to a reference input of the first and second switching units and an output terminal connected to the low pass filters of the first and second switching units and the second differential amplifier has a first input terminal connected to the second low frequency mixer input, a second input terminal connected to a reference input of the third and fourth switching units and an output terminal connected to the low pass filters of the third and fourth switching units.

8. A mixer as claimed in claim 1, wherein each switching device comprises a transistor.

9. A mixer as claimed in claim 8, wherein means are provided for biasing each transistor.

10. A mixer as claimed in claim 8, wherein the biasing means are arranged such that each transistor operates in saturation mode.

11. A mixer as claimed in claim 8, wherein the biasing means for the first and second switching units comprise the first feedback loop and the biasing means for the third and fourth switching units comprise the second feedback loop.

12. A radio transceiver comprising a mixer as claimed in claim 1, and wherein the pair of low frequency mixer inputs are connected to receive a baseband signal therebetween, the pair of high frequency mixer inputs are connected to receive a local oscillator signal therebetween and the mixer outputs are connected to a transmitter output.

13. An integrated circuit comprising a mixer as claimed in claim 1, and wherein the pair of low frequency mixer inputs are connected to receive a baseband signal therebetween, the pair of high frequency mixer inputs are connected to receive a local oscillator signal therebetween and the mixer outputs are connected to a transmitter output.

* * * * *